United States Patent
Achtner et al.

(10) Patent No.: US 6,870,131 B2
(45) Date of Patent: Mar. 22, 2005

(54) MOUNTING RECEPTACLE FOR WELDING APPARATUS COMPONENT

(75) Inventors: Richard M. Achtner, Neenah, WI (US); James J. Cigelske, Jr., Menasha, WI (US)

(73) Assignee: Illinois Tool Works Inc., Glenview, IL (US)

( * ) Notice: Subject to any disclaimer, the term of this patent is extended or adjusted under 35 U.S.C. 154(b) by 214 days.

(21) Appl. No.: 10/065,572

(22) Filed: Oct. 31, 2002

(65) Prior Publication Data

US 2004/0084429 A1 May 6, 2004

(51) Int. Cl.[7] ................................................. B23K 9/10
(52) U.S. Cl. .................................... 219/130.1; 219/136
(58) Field of Search .............................. 219/130.1, 136; 361/615, 732, 733; 174/66

(56) References Cited

U.S. PATENT DOCUMENTS

| | | | | |
|---|---|---|---|---|
| 5,799,986 A | * | 9/1998 | Corbett et al. | ................ 285/55 |
| 6,198,072 B1 | * | 3/2001 | Peters | ..................... 219/130.1 |
| 6,489,591 B1 | * | 12/2002 | Achtner | ................... 219/130.1 |
| 6,633,485 B1 | * | 10/2003 | Sigl et al. | .................... 361/718 |
| 6,648,698 B1 | * | 11/2003 | Achtner | ...................... 439/737 |

* cited by examiner

Primary Examiner—Kiley S. Stoner
Assistant Examiner—Len Tran
(74) Attorney, Agent, or Firm—Ziolkowski Patent Solutions Group, LLC

(57) ABSTRACT

A welding apparatus having a specially designed receptacle that is formed on the rear molded plastic panel that is affixed to an enclosure in assembling the welding apparatus. A gas valve having a hexagonal body fits snugly into a mating hexagonal shaped of the receptacle. A pair of fingers extend outwardly from the rear panel and have distal ends with barbs formed thereon. In the assembly of the welding apparatus, therefore, the gas valve is simply inserted into the complementary shaped receptacle formed in the rear panel and the barbs snap over the external surface of the gas valve to retain the gas in the desired position affixed to the rear panel while automatically aligning a gas inlet port of the gas valve with an opening in the rear panel to allow accessibility of the gas inlet to an external source of gas.

19 Claims, 4 Drawing Sheets

MOUNTING RECEPTACLE FOR WELDING APPARATUS COMPONENT

BACKGROUND OF INVENTION

The present invention relates generally to a welding apparatus and, more particularly, a welding apparatus having a receptacle to facilitate the mounting of a component of the welding apparatus.

In the construction and assembly of various types of apparatus, the actual assembly of the apparatus is an important factor in the overall cost of the production of the apparatus and, therefore, it is of paramount importance that the cost of assembly procedures and assembly steps be kept to a minimum while still, obviously, providing a quality apparatus that is robust and therefore desirable to the customer.

As such, it is therefore important to facilitate the assembly process of such apparatus to minimize the individual steps that are required by the assembler in the assembly line in order to make those assembly steps as simple to carry out as possible, within the aforementioned guidelines, so as to reduce the cost of manufacturing the apparatus. Since the time that it takes to carry out any particular step in the assembly process is also costly, it is, therefore, of importance to make the assembly of an apparatus require a minimum of manipulations by the assembler and preferably without the use of hand tools or separate fasteners or hardware that is needed to affix a component to the apparatus.

In the case of welding apparatus, one of such components that must be assembled is a solenoid gas valve and which is a component that is added to the apparatus during the assembly line in the manufacturing facilities and therefore any steps to better facilitate its installation to the apparatus would be advantageous in reducing the cost of such manufacture. The welding apparatus itself comprises an enclosure to which there is affixed, end panels that are generally constructed of a molded plastic material. There are certain needs for such mounting, that is, the gas valve requires an inlet port that is accessible external of the welding apparatus so that a separate supply of a shielding gas can readily be connected to the inlet port and conventionally, that inlet port is a female pipe threaded opening to which a male pipe threaded connection is connected to supply the shielding gas to the gas valve.

Thus, the gas valve, when mounted, must be affixed to the end panel in a manner that is resistant to torsional forces since the male gas fitting is screwed into the female inlet port of the gas valve and the tightening and untightening of the connection can impose considerable torsional forces on the gas valve itself. The gas valve is normally, therefore, assembled by being mounted to the internal surface of one of the end panels with accessibility of the inlet port external of the end panel.

At the present, the gas valve has a generally hexagonal configured body and its installation is carried out by inserting the valve through the back of an opening in an end panel and a retaining nut is affixed to the outside of the end panel to hold the valve tightly against the panel and thus the assembly requires extra assembly hardware, including retaining nuts, gaskets etc, as well as requiring costly assembly time necessary to actually retain the valve in the desired position within the welding apparatus.

Therefore, it would be advantageous to have a simple means of assembling the gas valve to an end panel of a welding apparatus to facilitate that assembly procedure while providing torsional strength to resist torsional forces that can be imposed on the gas valve while, at the same time, providing access to the inlet port of the gas valve external of the welding apparatus.

BRIEF DESCRIPTION OF INVENTION

The present invention is directed to an improved mounting means to facilitate the assembly of a component to an assembled apparatus, preferable a welding apparatus.

In the preferred embodiment, and as will be specifically described herein, the welding apparatus itself is comprised of a metal enclosure that houses the various components that are utilized in providing a variable power supply to carry out the welding process. The enclosure has a pair of end panels, that is, there is a front panel and a rear panel which are affixed to the enclosure to contain those components therein. The front and rear plastic panels are preferable constructed of a molded plastic material and each of the panels have inner surfaces that face the internal area of the welding apparatus and external surfaces that face outwardly from the internal area of the welding apparatus.

A mounting system is incorporated into the rear panel of the welding apparatus that enables the quick and easy assembly of a component into the rear panel during the assembly line production of the apparatus. In particular, the component is a gas valve that has a hexagonal housing and a gas inlet port that is adapted to be connected to an external source of a shielding gas.

The rear panel has a receptacle that is formed on the inner surface thereof and which comprises a plurality of sides that combine to form a hexagonal configuration and which is dimensioned such that the housing of the gas valve fits snugly into the receptacle. By the interfitting of the hexagonal configured housing of the gas valve and the hexagonal configured receptacle of the molded plastic rear panel together, the gas valve is constrained against rotational movement within the sides of the receptacle and thus can resist the torsional forces that are encountered by the gas valve when a external male threaded fitting is screwed into the female fitting of the inlet port in the gas valve.

In addition, with the insertion of the gas valve into the receptacle, the inlet port of the gas valve is automatically aligned with an opening formed in the rear panel to allow the external coupling of the source of shielding gas to the inlet port.

As a further feature of the present invention, there are a pair of fingers that extend outwardly from the inner surface of the rear panel, that is, the fingers extend inwardly into the enclosed area of the welding apparatus and the fingers are flexible and have distal ends that are formed into the configuration of barbs. The fingers are dimensioned such that the barbs snap around the external surface of the gas valve when it has been sufficiently interfitted into the receptacle and which firmly holds the gas valve within the receptacle and, of course, to the rear panel.

Thus, in the assembly of the present welding apparatus, there is no need for additional hardware or complicated procedures to be carried out by the assembler in affixing the gas valve into its proper, aligned location onto the rear panel, that is, the assembler only needs to insert the gas valve into the specially, complementary shaped receptacle and, as the gas valve is inserted into the proper position, the barbed distal ends of the fingers snap over the external surface of the gas valve such that the gas valve simply snaps into its operative position. As such, the assembly of the gas valve to the rear panel is greatly simplified and easy to accomplish without the need for tools for the assembly or the need for additional hardware, such as screws, that can add valuable time and cost to the assembly process.

Various other features, objects and advantages of the present invention will be made apparent from the following detailed description and the drawings.

BRIEF DESCRIPTION OF DRAWINGS

The drawings illustrate one preferred embodiment presently contemplated for carrying out the invention.

In the drawings.

DETAILED DESCRIPTION

Figure 1:
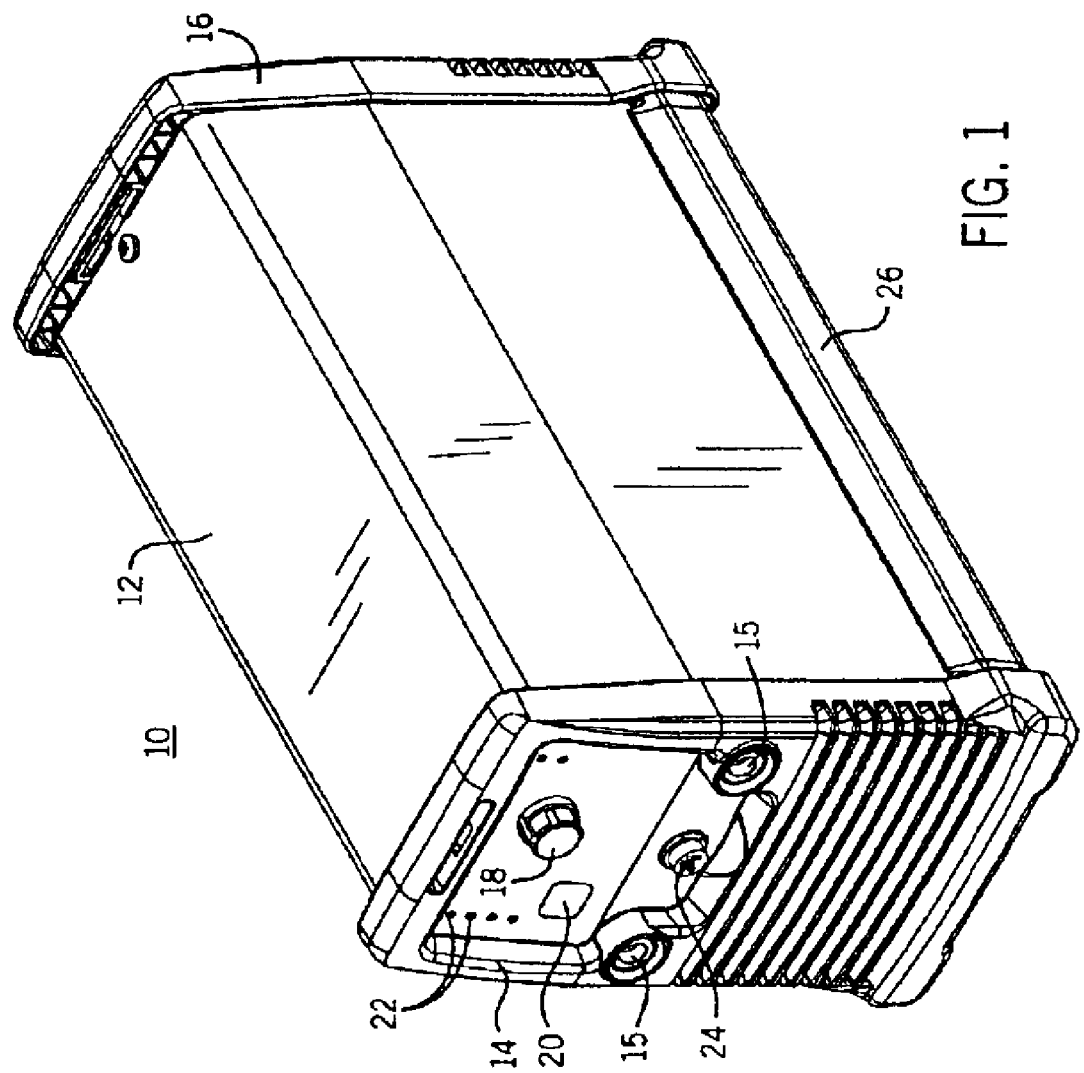
FIG. 1 is a perspective view of a welding apparatus for which the present invention is applicable.

Referring now to FIG. 1, there is shown a welding apparatus 10 that utilizes the present invention. As can be seen, the welding apparatus 10 comprises an enclosure 12 that is a sheet metal construction, preferable of aluminum and having a front panel 14 and a rear panel 16. Both the front and rear panels 14, 16 are preferably constructed of a molded plastic material. The front panel 14 has a central control section and which includes the various controls for the welding functions and can include female connectors 15 that are used to connect the welding cables.

A control knob 18 is provided in order to control the current to the welding electrodes and a selector button 20 is provided to enable the welding apparatus to be switched between TIG and stick operation. There may also be a series of LEDs 22 to provide an indication of status of the welding apparatus and to provide information as to its operation. A remote connector plug 24 is also used for the operation of remote controls such as a foot operated switch for the welding apparatus 10.

A base 26 is located underneath the enclosure 12 and can also be a molded plastic construction and, as can be seen, the base 26 can be actually elevated with respect to the floor such that the welding apparatus 10 contacts the floor through the front and rear panels 14, 16.

Figure 2:
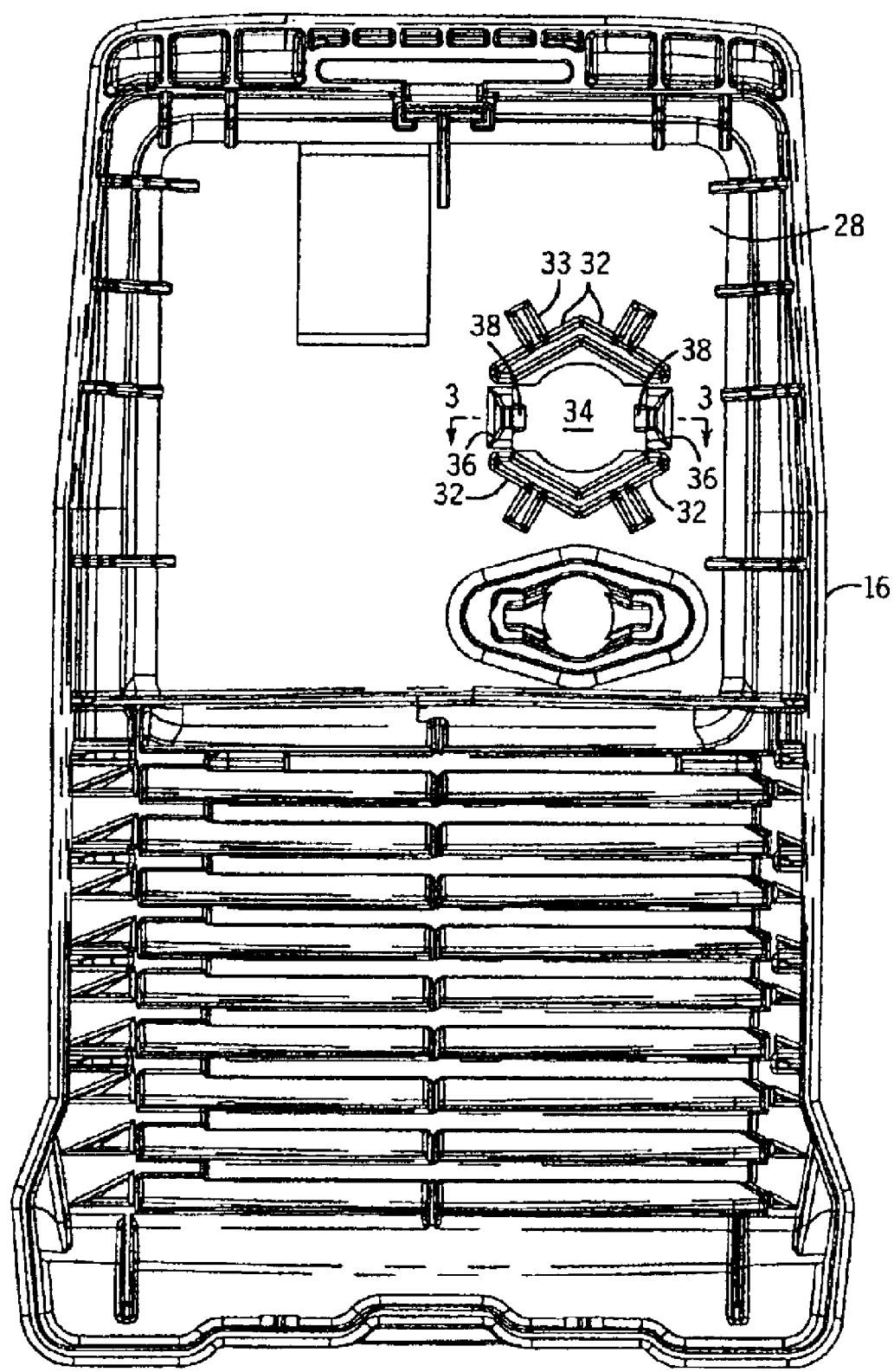
FIG. 2 is a front plan view of the interior surface of a rear panel of the welding apparatus of FIG. 1.

Turning now to FIG. 2, taken along with FIG. 1, there is shown the internal surface 28 of the rear panel 16, that is, the surface that faces internal of the welding apparatus 10 when the welding apparatus 10 is assembled. The rear panel 16, as indicated, is a molded plastic material and into the molded plastic is formed a receptacle 30 that extends outwardly from the internal surface 28 of the rear panel 16, that is, the receptacle 30 extends inwardly toward the internal area of the welding apparatus 10.

The receptacle 30 is formed by a plurality of sides 32 in the configuration of a polygon and, as shown in FIG. 2, preferably that polygonal configuration is a hexagonal shape and is strengthen by ribs 33 to maintain the integrity of the receptacle 30. The receptacle 30 surrounds an opening 34 formed in the rear panel 16 and the purpose of the opening 34 will be later explained. As also can be seen in FIG. 2, there are a pair of fingers 36 that also extend outwardly from the internal surface 28 of the rear panel 16 and each of the fingers 36 have distal ends formed into barbs 38.

According, therefore, as can be seen in FIG. 2, while the receptacle 30 is hexagonal, that hexagonal configuration is achieved by utilizing the four (4) sides 32 and the two (2) fingers 36 that complement each other to form the peripheral inner surface of the receptacle 30 in the hexagonal configuration.

Figure 3:
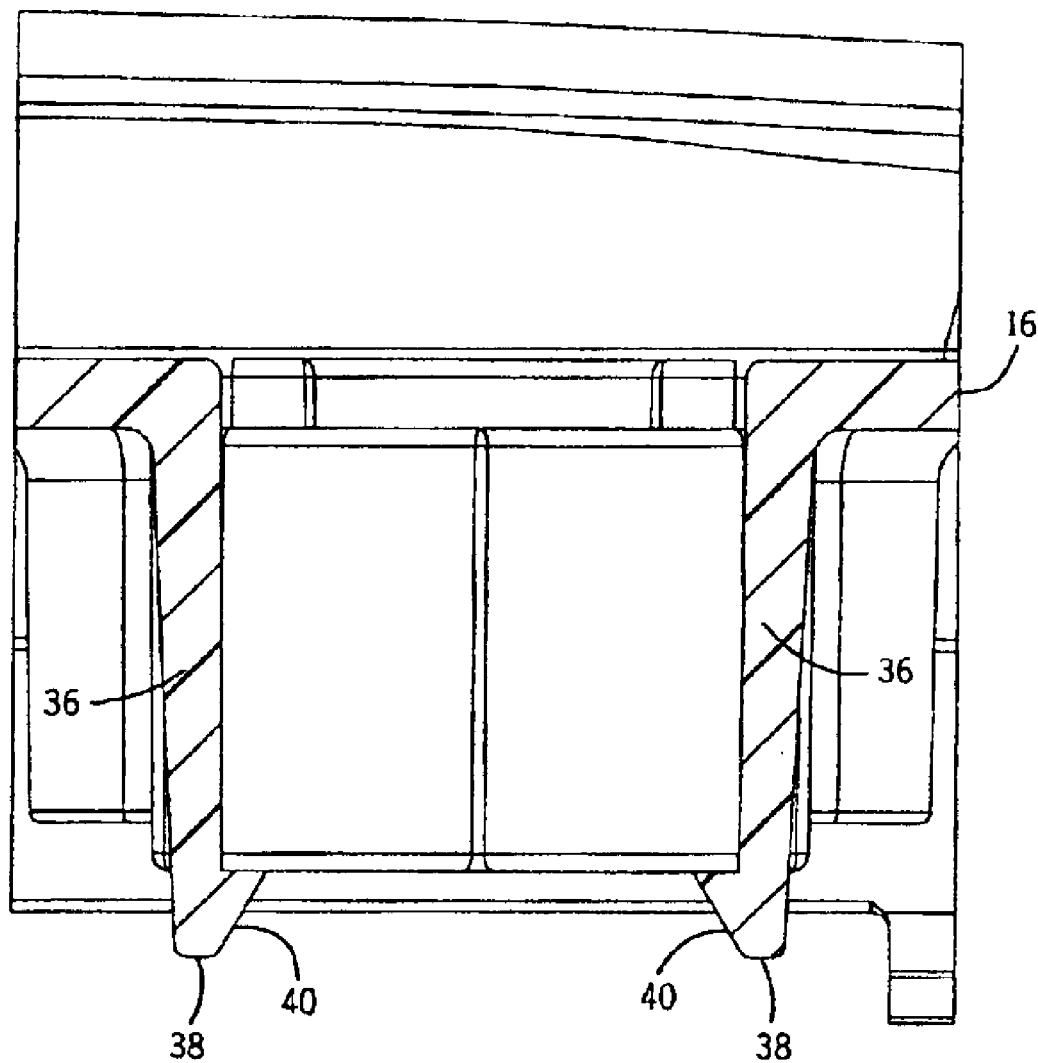
FIG. 3 is a side cross sectional view of the fingers of the present invention taken along the line 3—3 of FIG. 2.

Turning now to FIG. 3, there is shown, a cross sectional view taken along the line 3—3 of FIG. 2 and better illustrating the configuration of the fingers 36 with the barbs 38 formed at the distal ends thereof. Thus, in FIG. 3, the barbs 38 have a flexibility due to the location at the ends of the plastic fingers 36 and have inwardly tapering surface 40 to receive a component to be affixed to the rear panel 16 within the receptacle 30.

Figure 4:
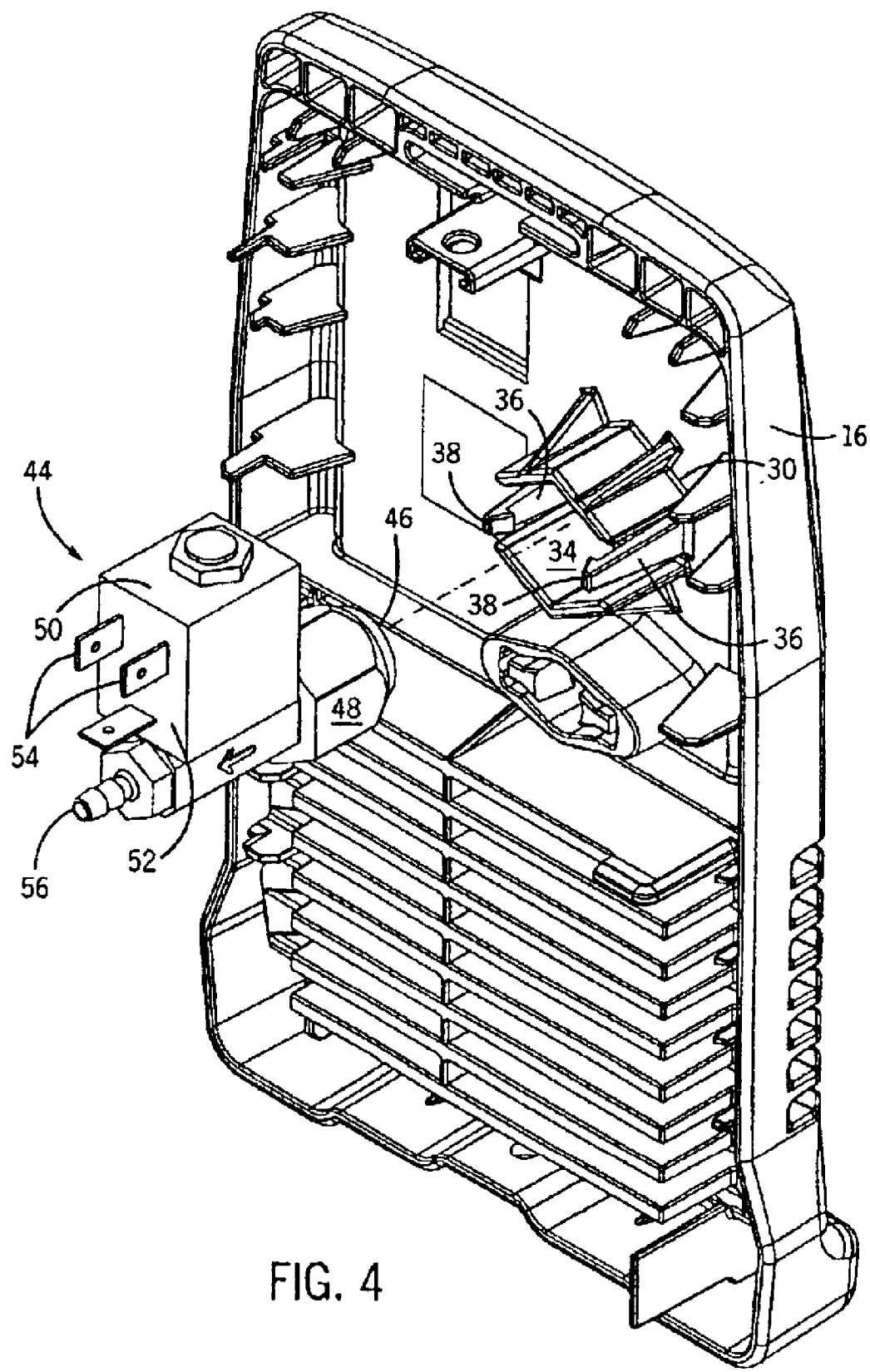
FIG. 4 is an exploded view of the rear panel of the invention showing the affixation of the gas valve to the rear panel.

Turning finally to FIG. 4, there is shown an exploded view of the rear panel 16 and also showing a gas valve 44 that is to be affixed within the receptacle 30 formed in the rear panel 16. In this Fig., it can be seen that the gas valve 44 has a conventional gas inlet port 46, conventionally sized, and has a hexagonal inlet port body 48 that is hexagonal in configuration. Accordingly, with the inlet port body 48 having a hexagonal configuration and the receptacle 30 also formed in a hexagonal configuration, the gas valve 44 can be inserted into the receptacle 30 and is dimensioned such that the gas inlet body 48 fits snugly into the receptacle 30 wherein the gas valve 44 is constrained from rotational movement with respect to the receptacle 30.

As such, since the inlet port 46 is conventionally a threaded female fitting, the inlet port 46 of the gas valve 44 can receive a male fitting and the male fitting and threaded female fitting of the inlet port 46 can be screwed together without causing a rotation of the gas valve 44, that is, the mounting of the gas valve 44 within the receptacle 30 provides good resistance to torsional forces imposed during the attachment and detachment of a male connector to the inlet port 46 of the gas valve 44.

The gas valve 44 also has a housing 50 that includes an external rear surface 52 having the various electrical blade connectors 54 to make an electrical connection to a connector to operate the gas valve 44 and also has an outlet port 56.

Accordingly, the assembly of the gas valve 44 can now be explained. The gas valve 44 can be assembled to the rear panel 16 by simply inserting the gas valve 44 into the receptacle 30 such that the hexagonal configuration of the gas inlet body 48 fits snugly into the hexagonal configuration of the receptacle 30 while the inlet port 46 automatically aligns with the opening 34 in the rear panel 16 to be accessible for connection to a source of shielding gas external of the welding apparatus 10. As the gas valve 44 is finally seated in the desired position within the receptacle 30 the barbs 38 at the distal ends of the fingers 36 snap over the gas inlet body 48 so as to retain the gas valve 44 within the receptacle 30.

Therefore the assembly of the gas valve 44 to the rear panel 16 can be readily and easily accomplished without the need for any tools or complex operations or the need for additional hardware such as screws, gaskets and the like to carry out the assembly thereto and can thus save time in the assembly of the gas valve 44 to the rear panel 16 to facilitate the assembly of a welding apparatus 10.

As one skilled in the art will fully appreciate the aforementioned description of welding devices not only includes welders but also includes any system that requires high power outputs, such as heating and cutting systems.

Therefore, the present invention is equivalently applicable with any device requiring high power output, including welders, plasma cutters, induction heaters, and the like. Reference to welding power, welding-type power, or welders generally, includes welding, cutting, or heating power. Description of a welding apparatus illustrates just one embodiment in which the present invention may be implemented. The present invention is equivalently applicable with many high power systems, such as cutting and induction heating systems, or any similar systems.

The present invention has been described in terms of the preferred embodiment, and it is recognized that equivalents, alternatives, and modifications, aside from those expressly stated, are possible and within the scope of the appending claims.

What is claimed is:

1. A welding apparatus comprising an enclosure and a molded end panel affixed to the enclosure to form an enclosed area within the enclosure for locating components used in the welding apparatus, the molded end panel having an internal surface facing inwardly toward the enclosed area and an opening formed therein, a receptacle formed on the internal surface surrounding the opening, the receptacle comprised of a plurality of sides extending outwardly from the internal surface forming a polygonal configuration, at least one flexible finger extending outwardly from the internal surface, the at least one flexible finger having a distal end formed into a barb, the receptacle adapted to receive a component having a body shaped in the same polygonal configuration of the receptacle wherein the at least one flexible finger is adapted to fit over the component to retain the component within the receptacle.

2. The welding apparatus as defined in claim 1 wherein the polygonal configuration is a hexagonal configuration.

3. The welding apparatus as defined in claim 1 wherein the at least one flexible finger comprises a pair of flexible fingers oppositely disposed about the opening.

4. The welding apparatus as defined in claim 1 wherein the receptacle is adapted to receive a gas valve having an inlet port to align the inlet port with the opening formed in the end panel.

5. A welding apparatus comprising an enclosure and a molded end panel affixed to the enclosure to form an enclosed area within the enclosure for locating components used in the welding apparatus, the molded end panel having an internal surface facing inwardly toward the enclosed area and an opening formed therein, a receptacle formed on the internal surface surrounding the opening, the receptacle comprised of a plurality of sides extending outwardly from the internal surface forming a polygonal configuration, a pair of flexible fingers extending outwardly from the internal surface and having distal ends formed with barbs, a component having a polygon body adapted to interfit within the receptacle wherein the fingers fit over the component to retain the component within the receptacle.

6. The welding apparatus as defined in claim 5 wherein the component is a gas valve.

7. The welding apparatus as defined in claim 6 wherein the gas valve has an inlet port that is accessible external of the enclosed area through the opening.

8. The welding apparatus as defined in claim 7 wherein the inlet port is a threaded opening.

9. The welding apparatus as defined in claim 7 wherein the polygonal configuration of the receptacle and the polygon body of the gas valve are both hexagonal.

10. The welding apparatus as defined in claim 6 where the pair of fingers are located about 180 degrees apart about the opening.

11. A method of assembling a component to the surface of a molded plastic end panel of a welding type apparatus, said method comprising the steps of:

providing a molded plastic panel having a surface having an opening therein and having a polygonal receptacle extending outwardly from the surface formed by a plurality of sides surrounding the opening, the plastic panel also having at least one finger extending outwardly from the surface and having a distal end formed into a barb, providing a component to be affixed to the end panel having a polygonal body, inserting the component into the receptacle, causing the barb at the distal end of the at least one finger to hook over the component to retain the component within the receptacle.

12. The method as defined in claim 11 wherein the step of providing a component to be affixed to the end panel comprises providing a gas valve having a gas inlet port.

13. The method as defined in claim 12 wherein the step of inserting the component into the receptacle comprises aligning the gas inlet port with the opening in the panel.

14. The method as defined in claim 11 wherein the step of providing a component to be affixed to the end panel comprises providing a component having a hexagonal body.

15. The method as defined in claim 11 wherein the step of providing a molded plastic panel comprises providing a molded plastic panel having a pair of fingers oppositely spaced about the opening.

16. A welding type apparatus end panel adapted to be affixed to an enclosure, the end panel comprising a molded plastic body having a surface and an opening formed therein, a receptacle formed on the surface surrounding the opening, the receptacle comprised of a plurality of sides extending outwardly from the surface forming a polygonal configuration, at least one flexible finger extending outwardly from the surface and having a distal end formed with a barb, the receptacle adapted to receive a component having a body shaped in the same polygonal configuration of the receptacle wherein the at least one flexible finger is adapted to fit over the component to retain the component within the receptacle.

17. The welding type apparatus end panel as defined in claim 16 wherein the polygonal configuration is a hexagonal configuration.

18. The welding type apparatus end panel as defined in claim 16 wherein the at least one flexible finger comprises a pair of flexible fingers oppositely disposed about the opening.

19. The welding type apparatus end panel as defined in claim 17 wherein the hexagonal configuration is formed by a combination of the plurality of sides and the at least one flexible finger.

* * * * *